United States Patent [19]
Baba et al.

[11] Patent Number: 5,084,408
[45] Date of Patent: Jan. 28, 1992

[54] METHOD OF MAKING COMPLETE DIELECTRIC ISOLATION STRUCTURE IN SEMICONDUCTOR INTEGRATED CIRCUIT

[75] Inventors: Yoshiro Baba; Yutaka Koshino, both of Yokohama; Akihiko Osawa, Tokyo; Satoshi Yanagiya, Kawasaki, all of Japan

[73] Assignee: Kabushiki Kaisha Toshiba, Kawasaki, Japan

[21] Appl. No.: 596,294

[22] Filed: Oct. 15, 1990

[30] Foreign Application Priority Data

Oct. 16, 1989 [JP] Japan .................................. 1-268544

[51] Int. Cl.$^5$ ........................................... H01L 21/302
[52] U.S. Cl. ........................................ 437/62; 437/61; 437/67; 437/72; 437/73
[58] Field of Search ............... 437/61, 62, 67, 72, 437/73

[56] References Cited

U.S. PATENT DOCUMENTS

| | | | |
|---|---|---|---|
| 3,343,255 | 9/1967 | Donovan | 437/62 |
| 3,391,023 | 7/1968 | Frescura | 437/62 |
| 4,017,341 | 4/1977 | Suzuki | 437/62 |
| 4,645,564 | 2/1987 | Morie et al. | 148/DIG. 50 |
| 4,845,048 | 7/1989 | Tamaki | 437/73 |
| 4,916,086 | 4/1990 | Takahashi | 437/67 |
| 4,985,745 | 1/1991 | Kitahara | 437/62 |

*Primary Examiner*—Brian E. Hearn
*Assistant Examiner*—Trung Dang
*Attorney, Agent, or Firm*—Finnegan, Henderson, Farabow, Garrett, and Dunner

[57] ABSTRACT

For controlling unwanted production of crystal defects from corners of isolated regions in a complete dielectric isolation structure, after at least one trench or groove is provided through a mask of an insulating film in a semiconductor substrate adhered to an insulating film of a base substrate, the mask is side-etched and the insulating film of the base substrate is selectively etched at the same time to expose corners of the semiconductor substrate. The exposed corners of the semiconductor substrate is then subjected to isotropic etching to remove a pointed portion therefrom. Thereafter, side surfaces of the semiconductor substrate exposed within the trench is oxidized to provide an insulating film for dielectric isolation which has rounded corners.

8 Claims, 6 Drawing Sheets

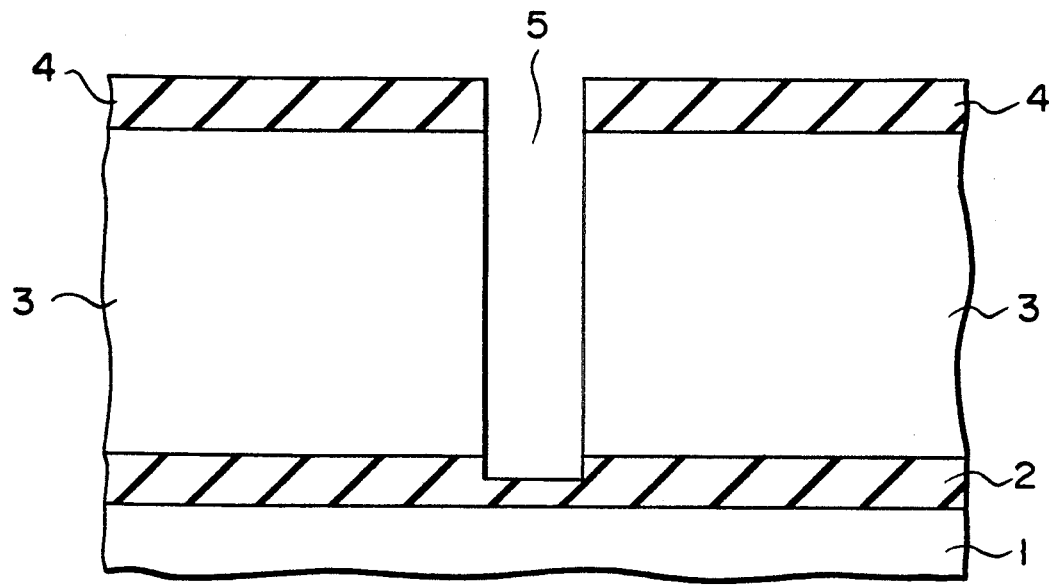
F I G. 1A
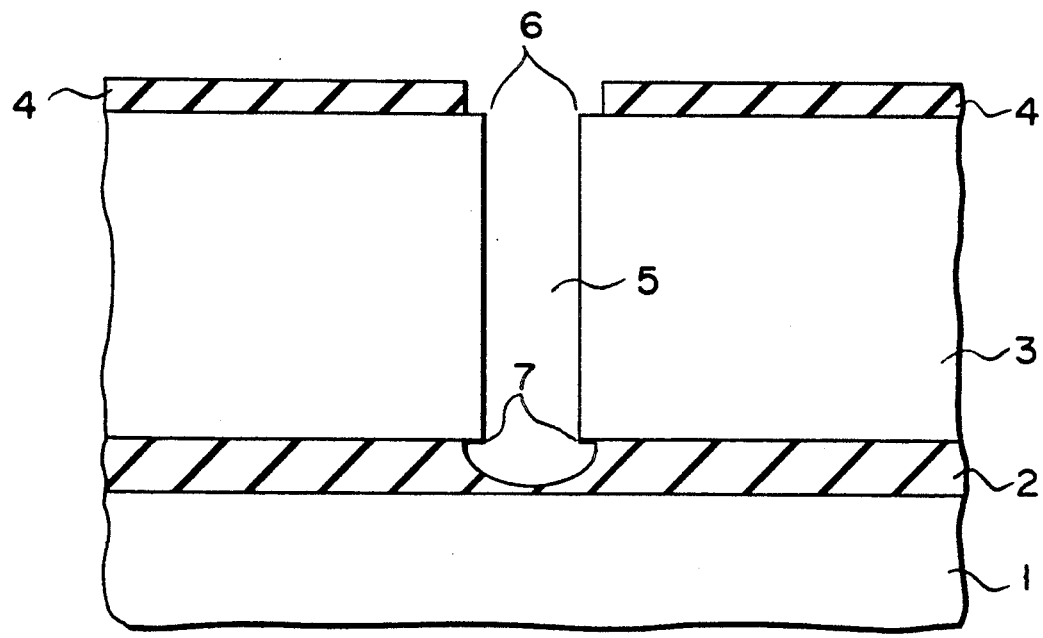
F I G. 1B

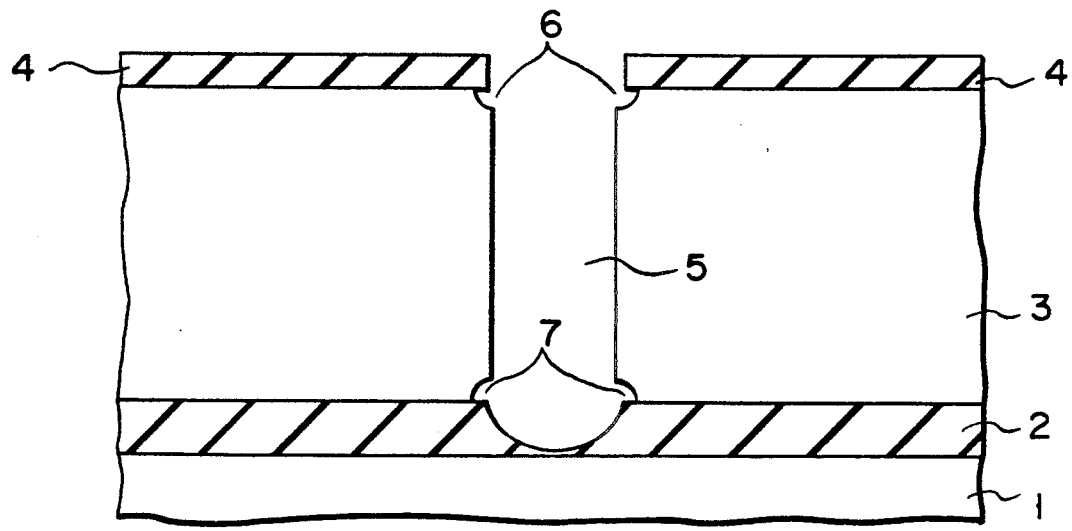
F I G. 1C
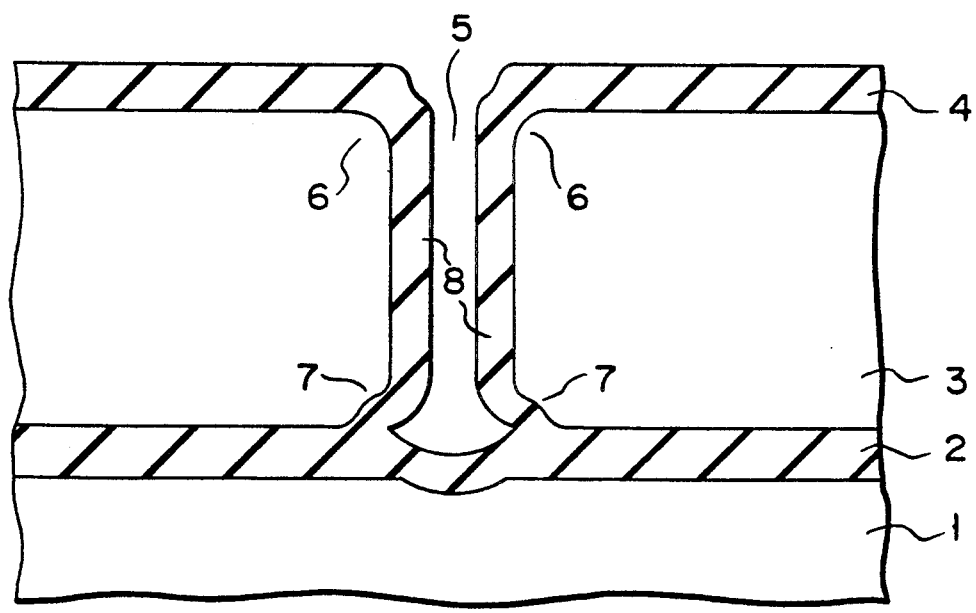
F I G. 1D

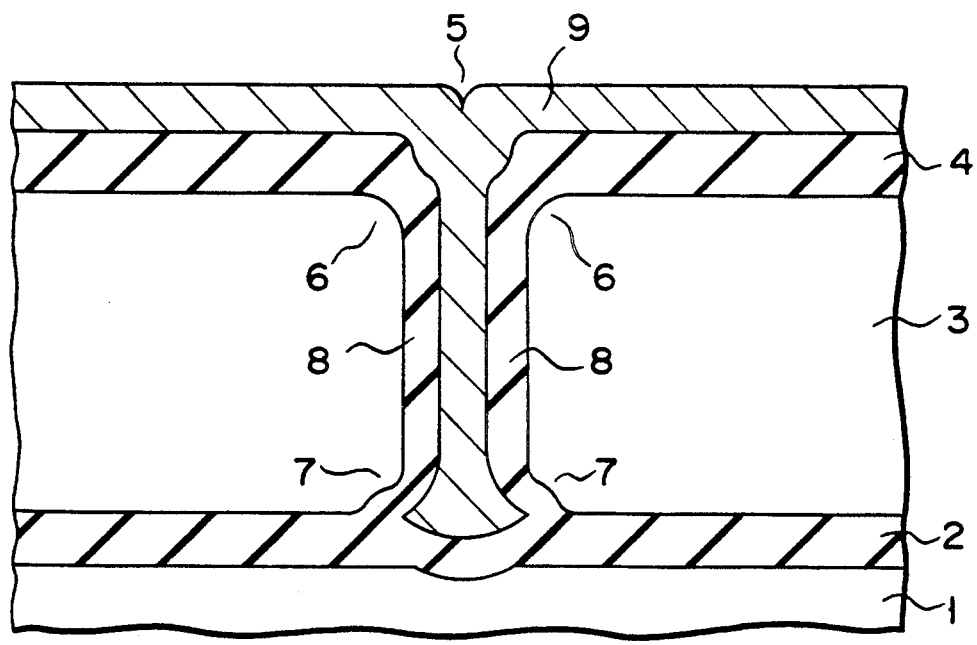
F I G. 1E
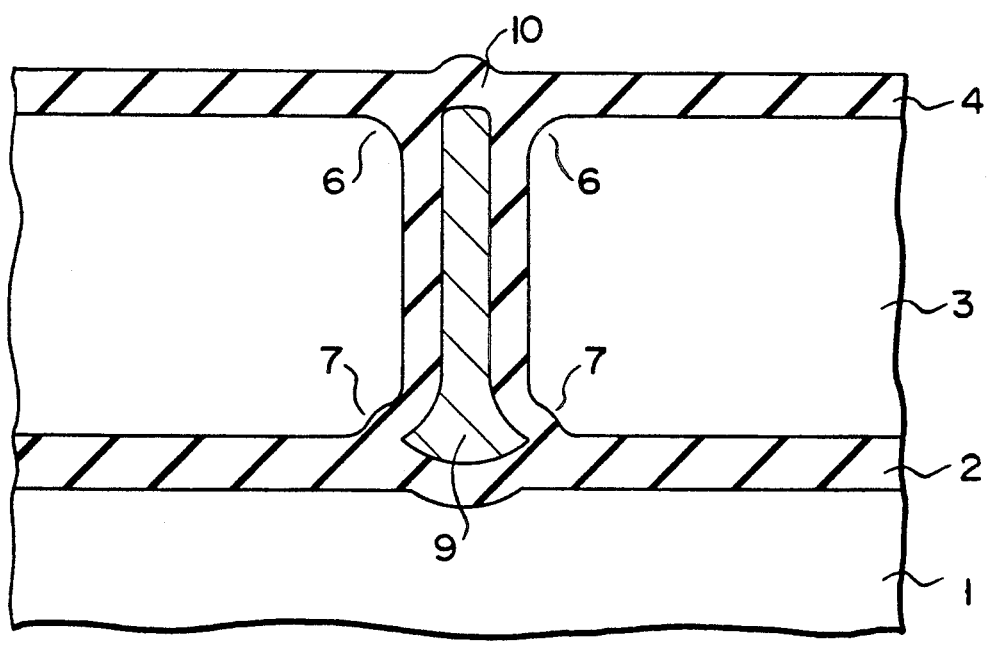
F I G. 1F

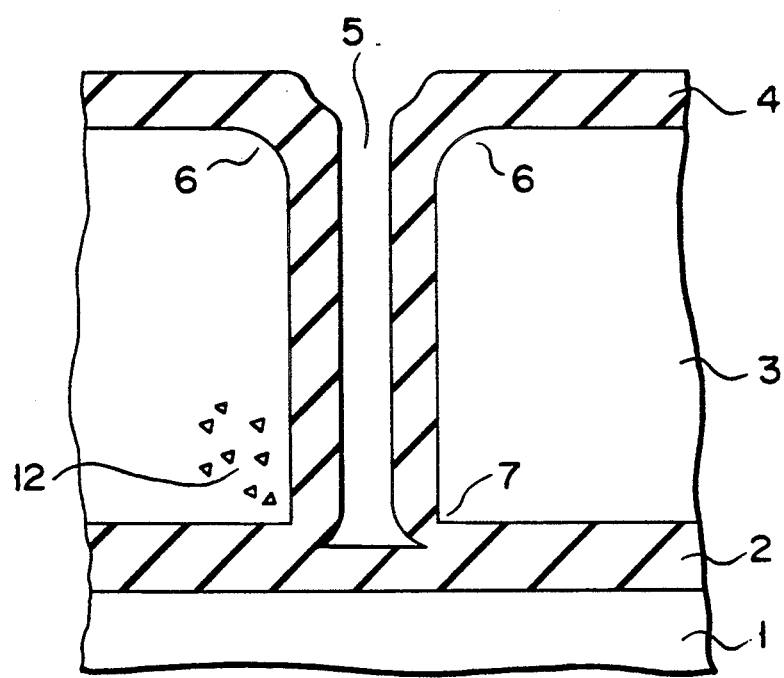
F I G. 3

METHOD OF MAKING COMPLETE DIELECTRIC ISOLATION STRUCTURE IN SEMICONDUCTOR INTEGRATED CIRCUIT

BACKGROUND OF THE INVENTION

1. Field of the Invention

The present invention relates to a method of making a dielectric isolation structure for electrically isolating circuit elements from one another in an integrated circuit.

2. Description of the Related Art

As dielectric insulating isolation techniques for electrically isolating circuit elements from one another in an integrated circuits, it has been known to provide a field oxide film on a semiconductor substrate by LOCOS techniques. A complete dielectric isolation structure which is obtained in the following manner has been also known. That is, a first semiconductor substrate is adhered to a second semiconductor substrate through an insulating layer, and trenches reaching the insulating layer are provided in the first semiconductor substrate. Thereafter, side walls of the trenches are oxidized to form an oxide film, and the trenches are filled with a dielectric material.

In such a complete dielectric isolation technique, it is necessary to round corners of the trenches. If the trenches do not have rounded portions at corners, an unwanted stress will occur at the corners of each trench in the step of forming the oxide film on the side walls thereof, resulting from a difference of thermal expansion coefficient between the insulating film on the second semiconductor substrate and the first semiconductor substrate. e.g., between silicon dioxide and silicon. As a result, a dislocation density of silicon crystal will be increased in proportion to the stress, thereby producing crystal defects at the corners of the trenches.

A conventional technique for rounding corners of a trench will be described below with reference to FIGS. 4A to 4D.

As shown in FIG. 4A, an oxide film 12, a nitride film 13 and an oxide film 14 are successively formed on a silicon semiconductor substrate 11, and then these films are patterned to obtain a mask for forming a trench. Using the mask, the semiconductor substrate 11 is etched by RIE (Reactive Ion Etching) techniques to provide a trench 15 therein.

As shown in FIG. 4B, the oxide films 12 and 14 in the mask are side-etched by a diluted HF solution by several 100 Å to expose corners 16 of the semiconductor substrate 11 in the trench 15.

As shown in FIG. 4C, the corners 16 of the semiconductor substrate 11 are removed by CDE (Chemical Dry Etching) techniques, using the oxide film 12 as a mask.

Finally, as shown in FIG. 4D, after the oxide film 12, the nitride film 13 and the oxide film 14 are removed, the entire surface of the substrate including side walls of the trench 15 is oxidized to form an oxide film 17, thereby rounding the corners 16.

In the above method of rounding the corners of the trench, important parameters for controlling the conditions of rounding the corners are both the amount of side-etching of the mask, i.e., the oxide film 12, by the diluted HF solution as shown in FIG. 4B and the amount of etching of the corners 16 of the semiconductor substrate 11 by the CDE as shown in FIG. 4C. In this case, the corners are rounded under conditions wherein the amount of side-etching of the oxide film 12 of about 500Å and the amount of etching is about 1,000 Å by the CDE.

On the other hand, in relation to the complete dielectric isolation structure, a trench reaching the insulating film is provided in a semiconductor substrate adhered to a base substrate through an insulation film. Thereafter, when the trench side walls are oxidized to form oxidized film 17, as shown in FIG. 4D, conditions necessary to achieve rounded upper and lower corners must be achieved.

However, when a desired complete dielectric isolation structure is to be produced the conditions that the side-etching amount of the oxide film for forming the mask is about 500 Å and the etching amount by the CDE is about 1,000 Å, the upper corners can be rounded, but it is difficult to round the lower corners. As a result, unwanted stress will be concentrated at the lower corners of the trench to increase the dislocation density of silicon crystal. Therefore crystal defects will be produced at the lower corners of the trench.

As described above, when such a conventional technique for rounding the upper corners of the trench is intended to be applied to the complete isolation structure in which portions of the trench to be rounded are present at the upper and lower corners, it will be difficult to round the lower corners, and unwanted crystal defects will be produced in the semiconductor substrate.

SUMMARY OF THE INVENTION

It is, therefore, an object of the present invention to provide a method of making an improved complete dielectric isolation structure.

It is another object of the present invention to provide a method of making a highly reliable semiconductor device by eliminating unwanted crystal defects in corners of trenches.

According to an aspect of the present invention, for controlling unwanted production of crystal defects from corners of isolated regions in a complete dielectric isolation structure, after at least one trench or groove is provided through a mask of an insulating film in a semiconductor substrate adhered to an insulating film of a base substrate, the mask is side-etched and the insulating film of the base substrate is selectiv-ely etched at the same time to expose corners of the semiconductor substrate. The exposed corners of the semiconductor substrate are then subjected to isotropic etching to remove a pointed portion therefrom. In this case, the amount of side-etching and the amount of isotropic etching are controlled so as to provide desired rounded corners in respective isolated regions. Thereafter, side surfaces of the semiconductor substrate exposed within the trench are oxidized to provide an insulating film for dielectric isolation which has rounded corners.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIGS. 1A to 1F are sectional views showing sequential steps of making a complete dielectric isolation structure according to an embodiment of the present invention;

FIG. 3 is a sectional view for explaining crystal defects which are produced by defectively rounding the corners of the trench.

DETAILED DESCRIPTION OF THE PREFERRED EMBODIMENTS

Figure 2:
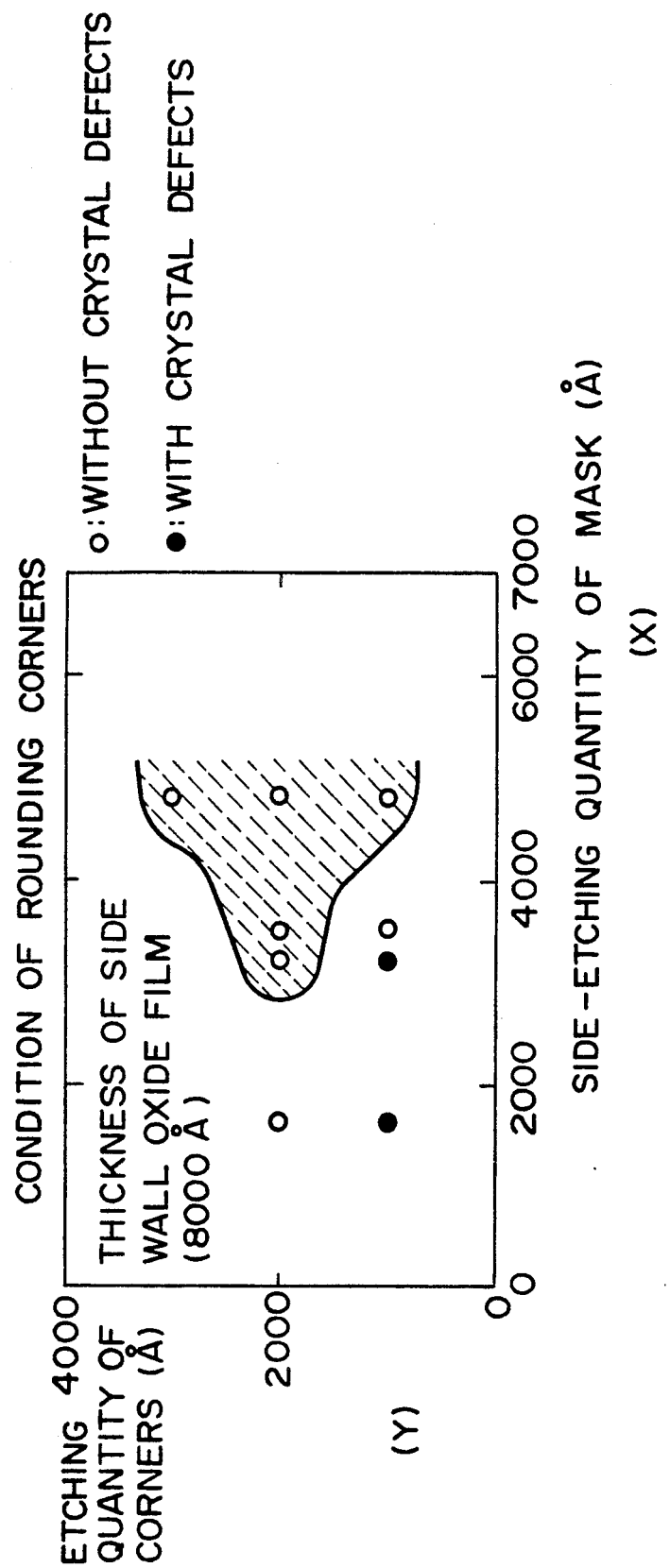
FIG. 2 is a graph for explaining a relationship between an amount of side-etching of an oxide film for forming a mask and an amount of etching of trench corners according to the present invention.
Figure 4A:
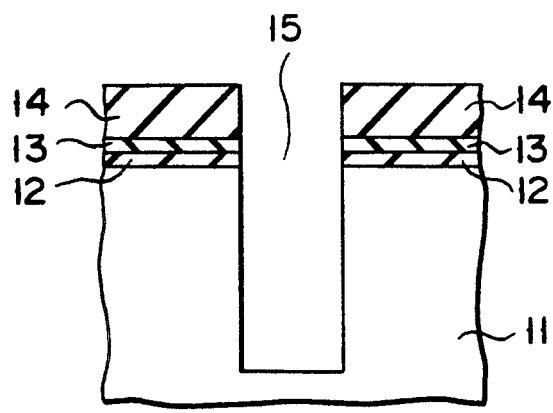
FIGS. 4A to 4D are sectional views showing the conventional sequential steps of roundinG corners of a trench.
Figure 4B:
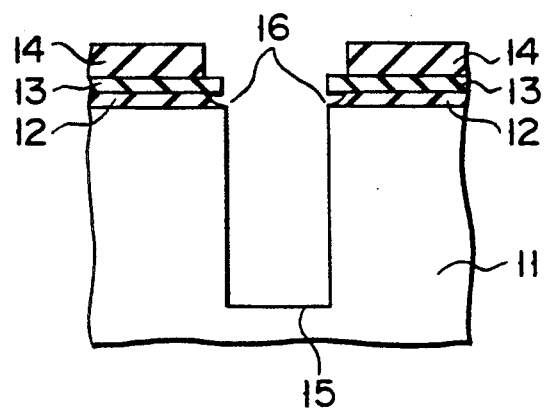
Figure 4C:
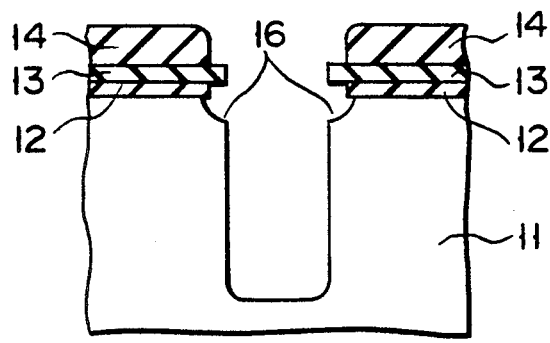
Figure 4D:
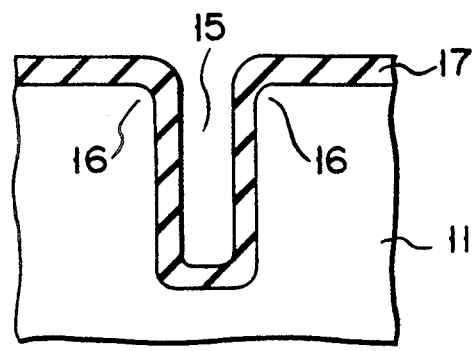

A method of making a complete dielectric isolation structure according to an embodiment of the present invention will be described below with reference to FIGS. 1A to 1F.

As shown in FIG. 1A, an insulating film 2 is formed on a silicon base substrate 1 to a thickness of the order of 1.5 μm by thermal oxidation techniques or the like, on which a silicon substrate 3 having a thickness of the order of 20 μm is adhered. Thereafter, an oxide film 4 formed on the silicon substrate 3 by the thermal oxidation techniques or the like is patterned to a desired configuration, and a trench 5 having a width of the order of 1 to 2 μm and a depth of the order of 20 μm is formed in the substrate 3 by RIE (Reactive Ion Etching) techniques so as to reach the insulating film 2, using the oxide film 4 as a mask.

As shown in FIG. 1B, the resultant structure is dipped in a diluted HF solution to side-etch the oxide film 4 used as the mask. In this case, the insulating film 2 of the silicon oxide film is etched at the same time to expose upper and lower corners 6 and 7 of the silicon substrate 3. In this step, it is necessary to side-etch the oxide film 4 by 3,000 Å or more, but the upper limit of the amount of etching is defined by 10,000 Å or less which is smaller than the thickness of the oxide film 4 after the trench etching is completed.

Thereafter, as shown in FIG. 1C, the silicon substrate 3 is isotropically etched by CDE (Chemical Dry Etching) techniques to remove the exposed corners 6 and 7. In this step, the corners 6 and 7 must be etched by 1,500 Å or more, but the upper limit is set to 5,000 Å or less in consideration of the area of isolation regions and a filling process of polysilicon.

As shown in FIG. ID, the resultant structure is heat-treated in an oxidizing atmosphere at a temperature of 1,050° C. for 150 minutes to form a side wall oxide film 8 havinq a thickness of the order of 8,000 Å on the side walls of the trench 5, thereby rounding the corners 6 and 7.

As shown in FIG. IE, a polysilicon layer 9 is deposited on the resultant structure to a thickness of the order of 1.8 μm by low pressure CVD techniques to fill the inner portion of the trench 5 therewith.

As shown in FIG. 1F, the surface of the resultant structure is etched back by the CDE technique to leave the polysilicon layer 9 inside the trench 5. Thereafter, the resultant structure is heat-treated in an oxidizing atmosphere at a temperature of 1,050 for 150 minutes to form an oxide film 10 on the polysilicon layer 9. Thus, isolated regions 11 which are dielectric-isolated from each other are provided.

According to the method of this embodiment, the reliability of the semiconductor device of the present invention depends greatly on the parameters for controlling the conditions of rounding of the corners, which are determined by both the side-etching amount in the case where the oxide films 2 and 4 are side-etched by the diluted HF solution in the step in FIG. 1B, and the etching amount of the corners 6 and 7 by the CDE in the step in FIG. 1C. FIG. 2 shows a relationship between the side-etching amount X of the oxide film 4 and the etching amount Y of the trench corners 6 and 7 when the thickness of the side wall oxide film 8 is 8,000 Å. According to FIG. 2, it is apparent that unwanted crystal defects, such as those designated as 12 in FIG. 2, are not produced at corners of isolated regions by controlling etching in an amount with ranges of $X \leq 3,000$ Å and $Y \leq 1,500$ Å. As shown if these etching ranges are not maintained, FIG. 3, in, when the side wall oxide film 8 having a thickness of about 8,000 Å on the side walls of the trench is formed in the same manner as in the step of FIG. 1D, the lower corners 7 cannot be rounded which results in the production of crystal defects 12.

Therefore, in order to round the corners of the trench, the side-etching amount of the oxide film serving as the mask and the etching amount of the corners are important factors.

As described above, according to the present invention, highly reliable semiconductor devices will be obtained since the production of crystal defects is eliminated from the isolated regions.

It is further understood by those skilled in the art that the foregoing description is a preferred embodiment of the disclosed method and that various changes and modifications may be made in the invention without departing from the spirit and scope thereof.

What is claimed is:

1. A method of making a complete dielectric isolation structure in a semiconductor integrated circuit comprising the steps of:

preparing a base substrate having a first insulating film thereon;

adhering a semiconductor substrate to said first insulating film of said base substrate;

forming a second insulating on said semiconductor substrate;

patterning said second insulating film to provide a mask on said semiconductor substrate;

selectively etching said semiconductor substrate through said mask to provide at least one trench reaching to said first insulating film, said trench having corners on said semiconductor substrate;

side-etching said mask in an amount required to achieve subsequent rounding of said corners and simultaneously selectively etching said first insulating film to expose said corners on said semiconductor substrate;

subjecting said exposed corners of said semiconductor substrate to isotropic etching;

oxidizing side surfaces of said semiconductor substrate exposed within said trench to provide a third insulating film thereon and to round said corners; and filling said trench with a polysilicon layer.

2. The method according to claim 1, wherein said corners of said semiconductor substrate include upper and lower corners.

3. The method according to claim 1, wherein said isotropic etching provides an arc-shaped recessed portion at said corners.

4. The method according to claim 1, wherein a thickness of said third insulating film is of the order of 8000 Å.

5. The method according to claim 1, wherein an amount of side-etching said mask is 3000 Å to ≦10000 Å, while an amount of isotropically etching said corners of said semiconductor substrate is 1500 Å to 5000 Å.

6. The method according to claim 1, wherein said base substrate is comprised of a semiconductor substrate.

7. The method according to claim 1, wherein an exposed surface of said polysilicon layer is oxidized.

8. The method according to claim 1, wherein said mask is comprised of said second insulating film.

* * * * *